United States Patent [19]

Okutsu et al.

[11] Patent Number: 4,530,604
[45] Date of Patent: Jul. 23, 1985

[54] METHOD OF ALIGNING A MASK AND A WAFER FOR MANUFACTURING SEMICONDUCTOR CIRCUIT ELEMENTS

[75] Inventors: Kazuhisa Okutsu; Katsumi Momose; Ryozo Hiraga, all of Yokohama, Japan

[73] Assignee: Canon Kabushiki Kaisha, Tokyo, Japan

[21] Appl. No.: 521,016

[22] Filed: Aug. 8, 1983

Related U.S. Application Data

[63] Continuation of Ser. No. 42,236, May 24, 1979, abandoned.

[30] Foreign Application Priority Data

Jun. 1, 1978 [JP] Japan ................................. 53-66400

[51] Int. Cl.³ .............................................. G01N 21/30
[52] U.S. Cl. ...................................... 356/401; 356/400
[58] Field of Search ................. 356/399, 400, 401, 150

[56] References Cited

U.S. PATENT DOCUMENTS

| 3,796,497 | 3/1974 | Mathisen et al. | 356/400 |
| 3,865,254 | 2/1975 | Johannsmeier | 414/676 |
| 4,070,117 | 1/1978 | Johannsmeier et al. | 356/401 |
| 4,127,777 | 11/1978 | Binder | 356/400 |
| 4,167,677 | 9/1979 | Suzki | 356/401 |

Primary Examiner—R. A. Rosenberger
Attorney, Agent, or Firm—Fitzpatrick, Cella, Harper & Scinto

[57] ABSTRACT

This specification discloses a method of aligning a mask and a wafer for manufacturing semiconductor circuit elements into a predetermined positional relationship. The method comprises two steps. In a first step, the mask and wafer are aligned by the use of relatively large alignment marks provided on the mask and wafer. In a second step, the mask and wafer are aligned by using relatively small key patterns provided on the mask and wafer and having substantially no positional deviation with respect to actual element (circuit) patterns.

1 Claim, 6 Drawing Figures

METHOD OF ALIGNING A MASK AND A WAFER FOR MANUFACTURING SEMICONDUCTOR CIRCUIT ELEMENTS

This is a continuation of U.S. patent application Ser. No. 042,236, filed May 24, 1979, now abandoned.

BACKGROUND OF THE INVENTION

1. Field of the Invention

This invention relates to a method of aligning a mask and a wafer used for the manufacture of semiconductor circuit elements such as IC, LSI or the like.

2. Description of the Prior Art

Usually, alignment between a mask and a wafer is effected by bringing the alignment marks provided on the mask and the alignment marks provided on the wafer into a predetermined positional relationship to thereby accomplish the alignment between the actual element (circuit) patterns of the mask and the actual element patterns of the wafer. The actual element patterns and the alignment marks of the mask are formed by the use of a photorepeater. That is, the actual element patterns 2 of the mask 1 shown in FIG. 1 of the accompanying drawings are formed by recording a reticle 4 for actual element pattern shown in FIG. 2 by the use of the step and repeat method, and alignment marks 3 are recorded by interchanging the reticle 4 with a reticle 5 for alignment mark shown in FIG. 3. In this case, since the reticle 4 for actual element pattern is interchanged with the reticle 5 for alignment mark, there may be created a positional error of the order of 1 to 3 μm between the actual element patterns 2 and the alignment marks 3. Therefore, when there is a positional error between the actual element patterns 2 and the alignment marks 3, there would be created an alignment error between the actual element patterns of the mask and the actual element patterns of the wafer even if the alignment between the mask and the wafer was effected accurately by the use of the alignment marks of the mask and the alignment marks of the wafer.

For this reason, heretofore, the actual element patterns of the mask and the actual element patterns of the wafer have been adjusted to each other by comparing the actual element patterns of the mask and the actual element patterns of the wafer to detect an amount of deviation between the actual element patterns and the alignment marks after the alignment marks of the mask and wafer have been adjusted to each other, and by moving at least one of the mask and wafer parallel to the other on the basis of the amount of deviation. After the mask pattern has been printed on the wafer, the thus printed wafer is retracted from the mask position and a new wafer, which is the same as the previous wafer with respect to the positional relationship between the actual element patterns and the alignment marks, is supplied to the mask position and in this case, the amount of deviation between the adjustment of the previous alignment marks and the adjustment of the actual element patterns is memorized; the adjustment between the alignment marks of this new wafer and the alignment marks of the mask is effected, whereafter at least one of the mask and the wafer is further moved parallel to the other on the basis of the memorized amount of deviation, whereby the actual element patterns of the mask and the actual element patterns of the wafer are adjusted into a predetermined positional relationship.

Thus, the alignment method of the prior art which involves the adjustment between the actual element patterns of the mask and wafer which are difficult to adjust suffers from a disadvantage that the alignment work is very difficult to do.

SUMMARY OF THE INVENTION

Accordingly, the method of the present invention eliminates the above-noted disadvantage by providing, in addition to the alignment marks, key patterns on both of the mask and wafer, which key patterns have substantially no positional deviation with respect to the actual element patterns and are independent of the actual element patterns, and by effecting adjustment of the actual element patterns by the use of such key patterns after the adjustment of the alignment marks. The key patterns having substantially no positional deviation with respect to the actual element patterns may be obtained by recording key patterns independent of the actual element patterns on the reticle when a mask is prepared by the use of the aforementioned photorepeater. These key patterns are recorded in the blank portion of the actual element patterns and therefore are very small. Accordingly, it would be very difficult to adjust such key patterns from the first. The present invention overcomes such difficulty by first effecting rough adjustment by the use of relatively large alignment marks, and then effecting fine adjustment by the use of the key patterns.

Masks and wafers having relatively small alignment marks provided in the blank portion of actual element patterns are disclosed in U.S. Pat. No. 3,796,497. However, that method of alignment between the mask and the wafer does not comprise adjusting the relatively large alignment marks and then further effecting adjustment by the use of relatively small key patterns as in the present invention. Further, the aforementioned patent has no mention of the fact that, as in the present invention, after the adjustment of the relatively large alignment marks, the amount of deviation of the aforementioned key patterns is detected to thereby detect the amount of deviation of the actual element patterns and on the basis of the detected value, correction is made when the alignment marks of the next wafer and the alignment marks of the mask are adjusted to each other, thereby effecting adjustment of the actual element patterns.

The invention will become more fully apparent from the following detailed description thereof taken in conjunction with the accompanying drawings.

DESCRIPTION OF THE PREFERRED EMBODIMENTS

Figure 1:
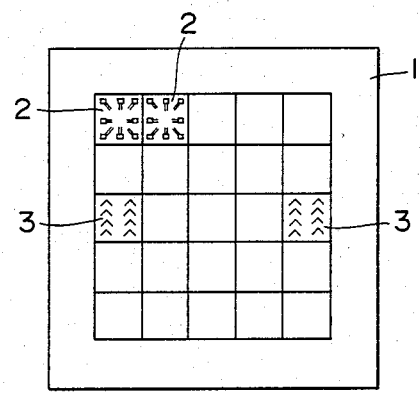
FIG. 1 shows a mask according to the prior art.
Figure 2:
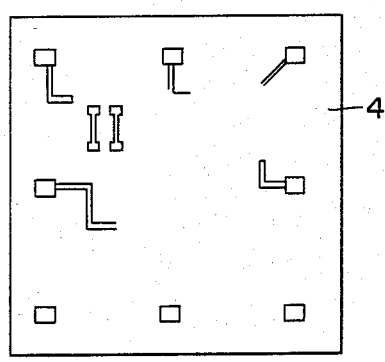
FIG. 2 shows a reticle for actual element pattern used to prepare the mask of FIG. 1.
Figure 3:
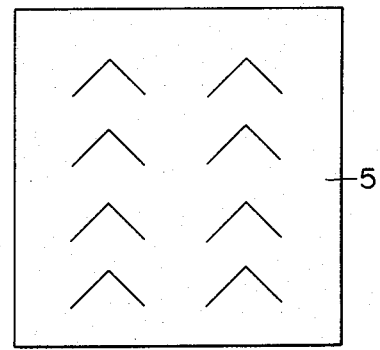
FIG. 3 shows a reticle for alignment mark used to prepare the mask of FIG. 1.

FIG. 1 shows a mask according to the prior art. The mask 1 has actual element patterns 2 and alignment marks 3. Such mask may be prepared by recording, on a reduced scale, a reticle for actual element pattern designated by 4 in FIG. 2 and a reticle for alignment mark designated by 5 in FIG. 3, by the use of a photorepeater. When the reticle 5 for alignment mark is recorded on the mask by the use of the photorepeater, as already described, it is interchanged with the reticle for actual element pattern and this creates an interchange error.

This in turn creates a case where the actual element patterns 2 and the alignment marks 3 are not in a predetermined positional relationship.

Also, with a wafer which is a material on which the image of a mask likewise prepared is printed, it is sometimes the case that the actual element patterns and the alignment marks are not in a predetermined positional relationship. Therefore, even if the alignment marks on the mask and wafer are adjusted to each other, it is not ensured that the actual element patterns on the mask and wafer are adjusted to each other. For this reason, as already described, it has heretofore been the practice to adjust the alignment marks of the mask and wafer, and then detect the amount of deviation between the actual element patterns of the mask and wafer and effect the adjustment. By memorizing such amount of deviation, during alignment of the next wafer, the wafer and mask are adjusted to each other by the alignment marks, whereafter at least one of them is moved parallel to the other by the memorized amount of deviation in the directions of x, y and e to thereby accomplish the adjustment of the actual element patterns.

Figure 4:
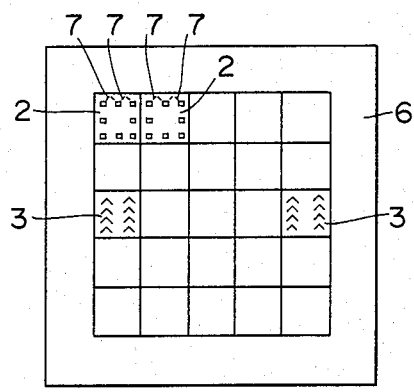
FIG. 4 shows a mask used in the method of the present invention.
Figure 5:
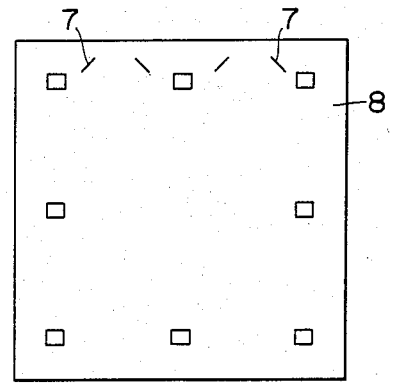
FIG. 5 shows a reticle used to prepare the mask of FIG. 4.

FIG. 4 shows a mask used in the method of the present invention. This mask 6, like the mask 1 of FIG. 1, has a plurality of actual element patterns 2. However, each of these actual element patterns has key patterns 7 provided on the actual element patterns 2 without any positional deviation. These actual element patterns 2 and the key patterns 7 are formed by a photorepeater by the use of the reticle 8 for actual element pattern shown in FIG. 5 and the reticle 5 for alignment marks shown in FIG. 3. The reticle 8 for actual element patterns shown in FIG. 5 is substantially similar to the reticle of FIG. 2 with the exception that the key patterns 7 are formed in the marginal portion of the actual element patterns. The positional accuracy of these key patterns 7 is within 1 μm on the reticle and since the reticle 7 is reduced to about 1/10 during the formation of the photomask, the positional accuracy on the photomask 6 is within 0.1 μm and thus, the positional deviation of the key patterns from the actual elements is nearly negligible error in case of one-to-one magnification printing. It may thus be said that there is substantially no positional deviation between the actual element patterns 2 of the photomask 6 and the key patterns 7.

The wafer will now be described. There are conceivable two types of wafer which may be adjusted to the mask of FIG. 4, namely, a wafer on which one mask has been printed or a wafer on which a plurality of masks have been printed, but for simplicity of description, a wafer on which one mask has been printed will hereinafter be explained.

The wafer which may be adjusted to the mask 6 of FIG. 4 is one on which the mask prepared in the same method as the mask 6 of FIG. 4 has already been recorded. That is, the mask already recorded has been prepared by the same method by the use of a reticle entirely similar to the reticle 8 for actual element pattern of FIG. 5 and the reticle 5 for alignment mark of FIG. 3 with the exception that the actual element pattern differs and the alignment marks 3 and the key patterns 7 differ in the marks 9 shown by solid line in FIG. 6.

Figure 6:
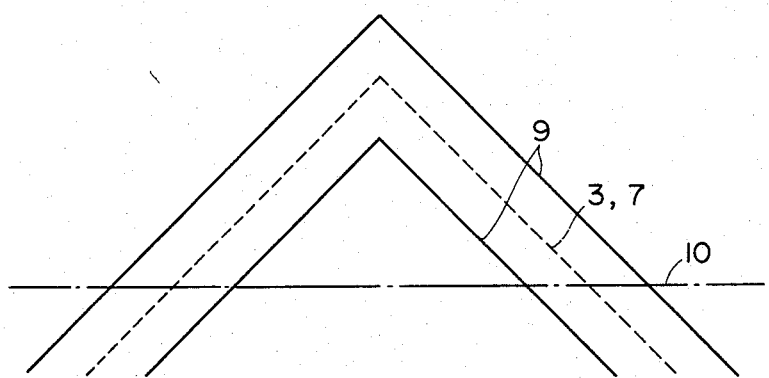
FIG. 6 shows the alignment marks of the mask and wafer.

The adjusted condition of the alignment marks and the key patterns of the mask and wafer is the condition as shown in FIG. 6 wherein the alignment mark of the mask is positioned intermediate the alignment marks or key patterns 9 of the wafer. Therefore, if the key patterns of the mask and wafer are adjusted to each other after the alignment marks of the mask and wafer are adjusted to each other, then the actual element patterns of the mask and wafer will become adjusted to each other. Also, when the next wafer and mask are to be adjusted to each other by detecting the amount of nonconformity between the key patterns of the mask and wafer after the alignment marks of the mask and wafer have been adjusted to each other and by memorizing that amount by a memory, the adjustment of the actual element patterns may be accomplished without adjusting the key patterns by moving one of the mask and wafer parallel to the other in the directions of x, y and e on the basis of the memorized value after the alignment marks of the mask and wafer have been adjusted.

The reading of the alignment marks and key patterns should desirably be effected by photoelectrically reading them along the scanning line 10 of FIG. 6 by the use of the device as disclosed in U.S. application Ser. No. 870,089 filed on Jan. 17, 1978, now U.S. Pat. No. 4,167,677 dated Sept. 11, 1979.

What we claim is:

1. A method of aligning wafers of the same type successively supported for relative parallel movement with respect to a mask, comprising the steps of:
   effecting rough alignment by using relatively large alignment marks provided on the mask and a first wafer;
   effecting fine alignment by using key patterns provided on said mask and said first wafer and having substantially no positional deviation with respect to actual element patterns;
   memorizing the amount of the fine alignment;
   supplying a second wafer of the same type as said first wafer instead of said first wafer;
   effecting rough alignment by using relatively large alignment marks provided on said mask and said second wafer; and moving one of said roughly aligned mask and second wafer relative and parallel to the other correspondingly to the amount of said fine alignment.

* * * * *